(12) United States Patent
Inui et al.

(10) Patent No.: US 9,011,068 B2
(45) Date of Patent: Apr. 21, 2015

(54) ARTICLE TRANSPORT FACILITY

(75) Inventors: Yoshitaka Inui, Omihachiman (JP); Mitsuru Yoshida, Higashiomi (JP)

(73) Assignee: Daifuku Co., Ltd., Osaka-shi (JP)

( * ) Notice: Subject to any disclaimer, the term of this patent is extended or adjusted under 35 U.S.C. 154(b) by 672 days.

(21) Appl. No.: 12/933,944

(22) PCT Filed: Jan. 15, 2009

(86) PCT No.: PCT/JP2009/050471
§ 371 (c)(1),
(2), (4) Date: Nov. 23, 2010

(87) PCT Pub. No.: WO2009/125615
PCT Pub. Date: Oct. 15, 2009

(65) Prior Publication Data
US 2011/0056900 A1    Mar. 10, 2011

(30) Foreign Application Priority Data
Apr. 9, 2008   (JP) .................................. 2008-101709

(51) Int. Cl.
*B65G 65/00*     (2006.01)
*H01L 21/687*     (2006.01)
(Continued)

(52) U.S. Cl.
CPC ............ *H01L 21/68707* (2013.01); *B65G 1/06* (2013.01); *H01L 21/67706* (2013.01); *H01L 21/67769* (2013.01); *Y10S 414/14* (2013.01)

(58) Field of Classification Search
CPC ............... B65G 1/06; H01L 21/67733; H01L 21/67769; H01L 21/67775
USPC ............ 212/98; 414/222.01, 222.04, 222.13, 414/277, 282, 373, 560, 608, 609, 612, 626, 414/659, 940, 222.07, 267
See application file for complete search history.

(56) References Cited

U.S. PATENT DOCUMENTS

| 4,678,390 A | 7/1987 | Bonneton et al. |
| 4,762,353 A * | 8/1988 | Molinaro ...................... 294/213 |
| 4,971,508 A | 11/1990 | Miyahara et al. |

(Continued)

FOREIGN PATENT DOCUMENTS

| DE | 3714638 A1 | 12/1988 |
| EP | 1627834 A1 | 2/2006 |

(Continued)

*Primary Examiner* — Saul Rodriguez
*Assistant Examiner* — Glenn Myers
(74) *Attorney, Agent, or Firm* — The Webb Law Firm

(57) ABSTRACT

Articles are stored while preventing disruption of the flow of clean air from an upper region to a lower region to alleviate degradation of clean air with an article supported by an article support. The article support (28) is provided with a movable body (30) which is supported to a fixed frame (29) to be movable in a far-near direction with respect to a travel path and which is formed to extend downwardly from the fixed frame (29), and a support member (31) formed to extend in the far-near direction from a lower end portion of the movable body (30). The support member (31) consists of a contact support portion (40) which is narrower than the width of an article in a direction along the travel path and which extends in the far-near direction from a lower end portion of the movable body, and a movement restricting portion (41) which extends in a direction along the travel path from the contact support portion (40), which has a vertical wall (41a) which contacts a side surface of an article, and which is narrower than the article in the far-near direction.

17 Claims, 10 Drawing Sheets

(51) Int. Cl.
  *H01L 21/677* (2006.01)
  *B65G 1/06* (2006.01)

(56) References Cited

U.S. PATENT DOCUMENTS

| | | | | |
|---|---|---|---|---|
| 6,183,184 B1* | 2/2001 | Shiwaku | | 414/281 |
| 6,468,021 B1* | 10/2002 | Bonora et al. | | 414/522 |
| 6,722,837 B2 | 4/2004 | Inui | | |
| 6,726,429 B2* | 4/2004 | Sackett et al. | | 414/217 |
| 6,885,437 B2* | 4/2005 | Nishi et al. | | 355/75 |
| 7,003,375 B2 | 2/2006 | Inui | | |
| 7,409,263 B2* | 8/2008 | Elliott et al. | | 700/218 |
| 7,441,999 B2* | 10/2008 | Nakao et al. | | 414/217.1 |
| 7,686,176 B2* | 3/2010 | Murata | | 212/332 |
| 7,735,625 B2* | 6/2010 | Schafer | | 198/370.09 |
| 7,780,020 B2 | 8/2010 | Yoshitaka | | |
| 7,789,019 B2* | 9/2010 | Kato | | 104/111 |
| 7,917,245 B2* | 3/2011 | Murata | | 700/224 |
| 7,984,543 B2* | 7/2011 | Elliott et al. | | 29/564.1 |
| 2002/0114685 A1* | 8/2002 | Inui | | 414/281 |
| 2004/0004167 A1* | 1/2004 | Huang et al. | | 248/178.1 |
| 2004/0091338 A1* | 5/2004 | Kim | | 414/217 |
| 2005/0139564 A1* | 6/2005 | Nakao et al. | | 212/71 |
| 2006/0051188 A1* | 3/2006 | Hoshino | | 414/277 |
| 2006/0051192 A1* | 3/2006 | Fujiki | | 414/626 |
| 2007/0059131 A1* | 3/2007 | Yoshitaka | | 414/217 |

FOREIGN PATENT DOCUMENTS

| | | |
|---|---|---|
| JP | 936196 A | 2/1997 |
| JP | 1045213 A | 2/1998 |
| JP | 200372912 A | 3/2003 |
| JP | 200372917 A | 3/2003 |
| JP | 200791463 A | 4/2007 |

* cited by examiner (a)

(b)

ARTICLE TRANSPORT FACILITY

BACKGROUND OF THE INVENTION

1. Field of the Invention

The present invention relates to an article transport facility comprising an article transporting body movable along a travel path provided near a ceiling and extending to pass by one or more article transfer locations corresponding to one or more article supports, wherein the article support is supported to a fixed frame installed in the ceiling to be movable relative to the fixed frame between a projected position, for article transfer, which projects toward the travel path, and a pulled back position which is farther away from the travel path, and wherein the article transporting body is configured to deliver an article to and receive an article from the article support in the projected position when the article transporting body is at rest in the article transfer location.

2. Description of the Related Art

An article transport facility, such as one described above, has a plurality of article transfer stations, to which articles are to be transferred, and which are arranged on the floor along the travel path. One or more article transporting bodies transport articles between the stations by rising and lowering a grip portion which is adapted to hold an article with the article suspended therefrom.

Article supports are provided to temporarily store articles to be transported to respective stations. An article support is usually located in the pulled back position which is located away from the fixed frame provided, for example, to one or both sides of the travel path so as not to interfere with the movement and such of the article transporting bodies. When storing an article in the article support, or when transporting an article currently stored in the article support, the article support is moved from the pulled back position to the projected position to have the article delivered to the article support by the grip portion, or to have the article received from the article support by the grip portion.

This type of article transport facility is installed, for example, in a clean room and the articles are temporarily stored in the article supports in a clean environment with little dust, by moving clean air from the ceiling region to a lower region. Therefore, a substantial disruption, for example by the fixed frame, of the flow of the clean air from the ceiling region to the lower region may result in degradation of clean air.

To this end, in a conventional article transport facility, an article support has a right-and-left pair of support arms that are supported to the fixed frame so as to be movable in the far-near direction, which is toward and away from the fixed frame, and that extend downwardly from the fixed frame and then toward the travel path in the far-near direction, and connecting members for connecting the portions, of the right-and-left pair of support arms, that extend toward the travel path in the far-near direction. (See, for example, Patent Document 1.) The right-and-left pair of support arms are spaced apart by a distance greater than the width of the article along the direction of the travel path so that the portions extending in the direction toward the travel path in the far-near direction may contact the sides of the article over its full width in the far-near direction. A plurality of connecting members is provided spaced apart from each other in the far-near direction, and are configured such that each of the plurality of connecting members contacts the bottom of the article.

In the conventional article transport facility, one pair of right and left fixed frames is sufficient to support each of the right-and-left pair of support arms for movement in the far-near direction. Therefore, the width of the fixed frame in the direction along the travel path can be made small, which can help prevent a substantial disruption of the flow of clean air from the ceiling region to the lower region by the fixed frame.

Patent Document 1: Japanese Patent Application Publication No. 2007-91463 (Pages 17-21; FIGS. 16-21)

SUMMARY OF THE INVENTION

In the above-mentioned conventional article transport facility, when the article support is supporting an article, the portions of the right-and-left pair of support arms that extend in the direction toward the travel path in the far-near direction are in contact with the sides of the article over its full width in the far-near direction. Thus, the support arms project out from the article in the direction along the travel path over the full width of the article in the far-near direction. Therefore, the downward flow of clean air is disrupted at lateral sides of the article in the direction along the travel path over the full width of the article in the far-near direction. This may cause degradation of clean air.

Also, when a plurality of article supports are provided to be arranged in the direction of the travel path, a large spacing needs to be provided between any two article supports to allow clean air to flow from the ceiling region to the lower region. Therefore, a large space will exist between article supports in the direction of the travel path, resulting in a large installation space in the direction of the travel path.

The present invention was made in light of this problem, and its object is to provide an article transport facility which can store articles while preventing a disruption of the flow of the clean air from the upper region toward the lower region when one or more article supports are supporting the articles to alleviate degradation of clean air.

To achieve this object, the first characteristic configuration of an article transport facility according to the present invention is that it comprises an article transporting body movable along a travel path provided near a ceiling and extending to pass by one or more article transfer locations corresponding to one or more article supports, wherein the article support is supported to a fixed frame installed in the ceiling to be movable relative to the fixed frame between a projected position, for article transfer, which projects toward the travel path, and a pulled back position which is farther away from the travel path, and wherein the article transporting body is configured to deliver an article to and receive an article from the article support in the projected position when the article transporting body is at rest in the article transfer location, characterized in that the article support includes a movable body supported by the fixed frame to be movable in a far-near direction with respect to the travel path and formed to extended downwardly from the fixed frame, and a support member extending along the far-near direction from the lower end portion of the movable body, and in that the support member includes a contact support portion which is narrower than the article in a direction along the travel path and which extends in the far-near direction from the lower end portion of the movable body, and a movement restricting portion which extends in the direction along the travel path from the contact support portion, and which is formed to be narrower than the article in the far-near direction with respect to the travel path, the movement restricting portion having a vertical wall portion for contacting a side surface of the article.

That is, since the article support includes a movable body movable in a far-near direction and formed to extended downwardly from the fixed frame, and a support member extending along the far-near direction from the lower end portion of the movable body, the fixed frame only needs a structure to support the movable body such that the movable body can move in the far-near direction. This allows the width of the fixed frame to be small in the direction along the travel path, and helps prevent the fixed frame from obstructing the flow of clean air from the ceiling region to the lower region.

The support member can contact the bottom of an article with the contact support portion to support the article, and any movement of the article in the direction along the travel path can be restricted by the vertical wall portion in the movement restricting portion by contacting a side surface of the article in the direction along the travel path. The contact support portion is narrower than the article in the direction along the travel path and the movement restricting portion is narrower than the article in the far-near direction. Thus, the only portion that projects outwardly of the article in the direction along the travel path is the movement restricting portion, which is narrower than the article in the far-near direction, thus, allowing a downward flow of clean air through both side regions of the movement restricting portion in the far-near direction. Further, the contact support portion, which is narrower than the width of the article in the direction along the travel path, contributes to weight savings and cost reduction of the article support.

Therefore, an article transport facility is provided, which can prevent obstructing the flow of the clean air from the ceiling region to the lower region and alleviate degradation of clean air with the article support supporting the article, and which can store articles while saving weight and reducing cost.

The second characteristic configuration of the article transport facility of the present invention is that a plurality of the article supports are provided adjacent one another along the travel path.

That is, as described above, at regions laterally of the article in the direction along the travel path, downward flow of clean air through both sides of the movement restricting portion in the far-near direction is allowed with the article support supporting the article, the space in the direction along the travel path for permitting downward flow of clean air between any two article supports may be made as small as possible. Thus, a plurality of article supports may be installed while reducing the distances between article supports in the direction along the travel path. Therefore, a plurality of article supports can be efficiently installed in a small space in the direction along the travel path.

The third characteristic configuration of the article transport facility of the present invention is that the contact support portion is formed to be narrower in width than the article in the far-near direction with respect to the travel path, and includes a far-near direction movement restricting portion extending in the far-near direction from the contact support portion and having a vertical wall portion which contacts a side surface of the article, the far-near direction movement restricting portion being formed to be narrower than the contact support portion in the direction along the travel path.

That is, because the contact support portion is formed to be narrower than the width of the article not only in the direction along the travel path but also in the far-near direction, a space can be provided between the contact support portion and the travel path in the far-near direction to permit downward flow of clean air when the article is not supported by the article support. This helps prevent obstruction of downward flow of clean air when no article is supported by the article support. Although the portion that contacts the bottom of the article becomes small by reducing the width of the contact support portion to within the width of the article in the direction along the travel path, any movement of the article in the far-near direction can be restricted by the vertical wall portion in the far-near direction movement restricting portion, which contacts a side surface of the article in the far-near direction. Thus obstruction of downward flow of clean air is prevented when no article is supported by the article support, and an article can be supported stably when an article is supported by the article support.

The fourth characteristic configuration of the article transport facility of the present invention is that a plurality of holes is formed in the contact support portion.

That is, the plurality of holes in the contact support portion can allow a downward flow of the clean air when no article is supported by the article support. Therefore, obstruction of downward flow of clean air can be reliably prevented when no article is supported by the article support.

The fifth characteristic configuration of the article transport facility of the present invention is that the fixed frame is positioned such that the fixed frame overlaps with the article support in the pulled back position in the direction along the travel path and in the far-near direction.

That is, since the fixed frame is positioned to overlap with the article support in the pulled back position in the horizontal direction, it does not disrupt the downward flow of clean air in addition to the article support, which helps reliably prevent obstruction of downward flow of clean air.

The sixth characteristic configuration of the article transport facility of the present invention is that a pair of support rail bodies spaced apart from each other in the far-near direction is provided for supporting the fixed frame such that the support rail bodies extend along the travel path, and the fixed frame is suspended and supported by the pair of support rail bodies such that the fixed frame is received and supported by a receptacle support portion of each of the pair of support rail bodies.

That is, when installing the article support in the ceiling region, the fixed frame can be installed such that it is suspended and supported by the ceiling simply by fixing the fixed frame received in the receptacle support portion in each of the pair of support rail bodies. Thus, installation of the article support can be simplified. Since the pair of support rail bodies are provided in the ceiling region such that they extend along the travel path, when installing a plurality of article supports that are arranged adjacent to each other in the direction along the travel path, the fixed frame in each of the plurality of article supports does not have to be suspended and supported to the ceiling. Instead, the fixed frame in each of the plurality of article supports needs only to be suspended and supported to the pair of support rail bodies. Therefore, there will be a substantial advantage of simplifying the installation when installing a plurality of article supports next to each other in the direction along the travel path.

DETAILED DESCRIPTION OF THE INVENTION

The preferred embodiment of the article transport facility in accordance with the present invention is described with reference to the drawings.

This article transport facility is provided, for example, in a clean room provided with a clean air ventilation means of a down-flow type which moves or directs clean air from a ceiling region to a lower region.

Figure 1:
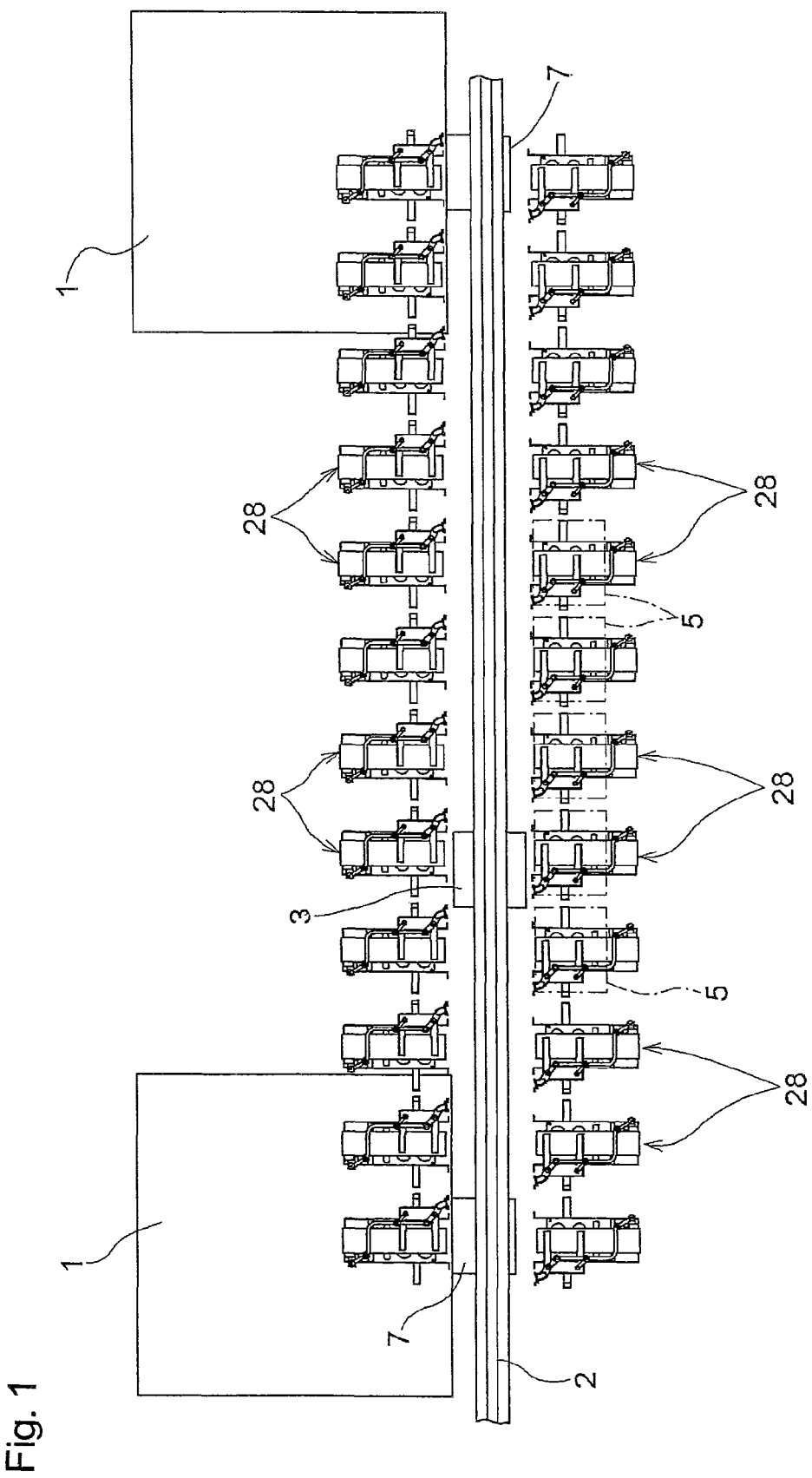
FIG. 1 is a plan view of the article transport facility.
Figure 2:
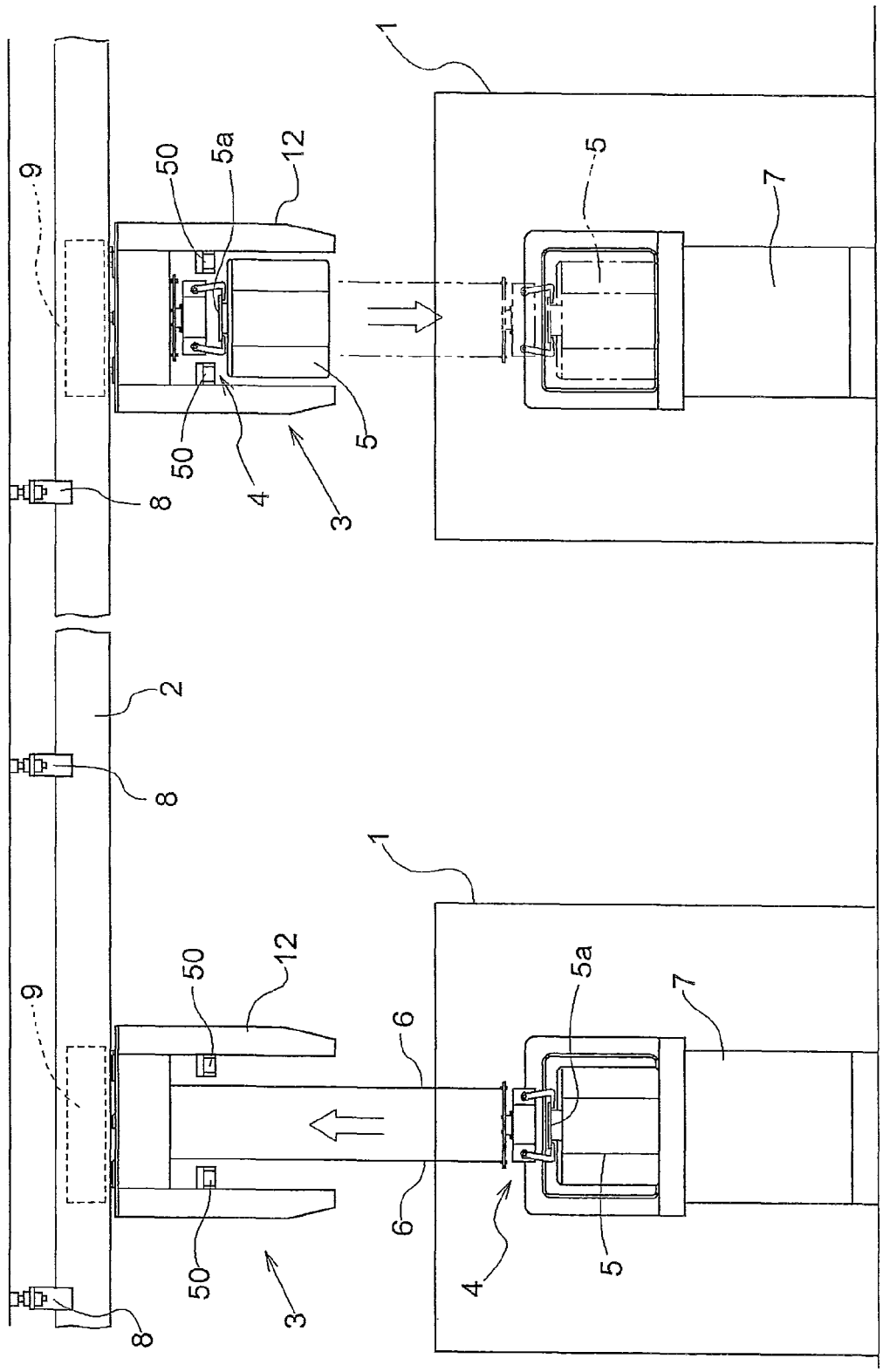
FIG. 2 is a side view of vehicles and stations.

As shown in FIGS. 1 and 2, the article transport facility has a guide rail 2 (i.e., travel path) installed such that the rail 2 extends by or along a plurality of article processors 1, and one or more vehicles 3 (i.e., article transporting body) which can move along this guide rail 2. Each vehicle 3 is configured to transport the container 5 (i.e., article), which store semiconductor substrates, among a plurality of article processors 1. Each article processor 1 is configured to perform a predetermined process on work-in-process parts in a manufacturing process of the semiconductor substrates etc.

The vehicle 3 has a vertically movable grip portion 4 which suspends and holds or grips the container 5. By winding or feeding out a wire 6 with the vehicle 3 at rest, the grip portion 4 is capable of moving vertically between a raised position close or closer to the vehicle 3 and a lowered position at which the grip portion 4 transfers an article to and from the article transfer station 7 installed below the vehicle 3. Incidentally, the upper part of FIG. 2 shows the grip portion 4 descending to the lowered position from the raised position, and the lower part of FIG. 2 shows the grip portion 4 being raised from the lowered position to the raised position.

Each station 7 consists of a support platform provided on the floor for supporting the container 5. The station 7 is provided to receive from the vehicle 3 a container 5 to which the article processor 1 performs a predetermined process, or to deliver to the vehicle 3 a container 5 on which a predetermined process has been performed by the article processor 1, and is provided in association with each of a plurality of article processors 1.

The vehicle 3 is configured to move along the guide rail 2 with the grip portion 4 located in the raised position, and to deliver and receive the container 5 to and from a station 7 by raising and lowering the grip portion 4 between the raised position and the lowered position while stopped at the stop position corresponding to a transfer target station 7 among a plurality of stations 7.

Figure 3:
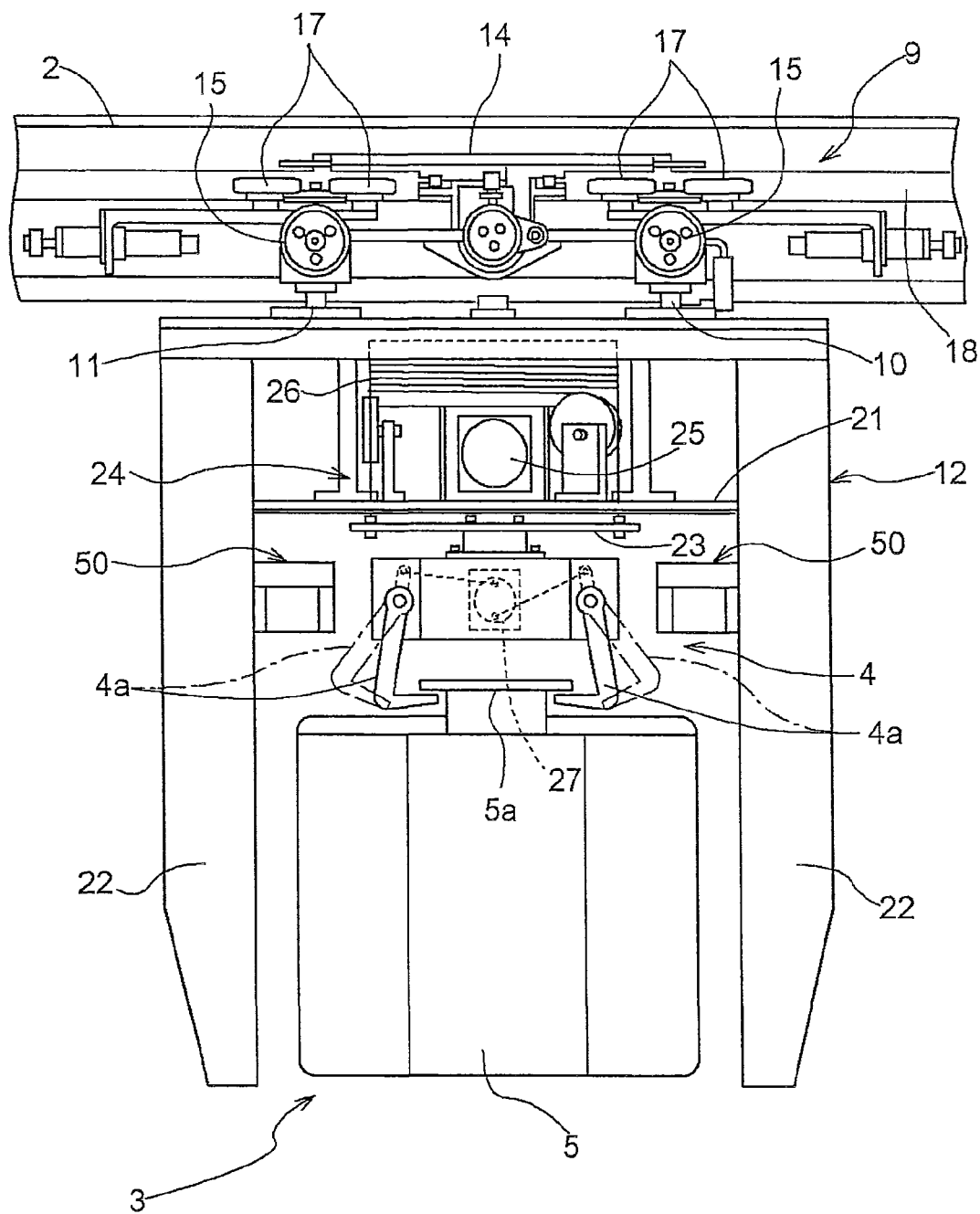
FIG. 3 is a side view of the vehicle.
Figure 4:
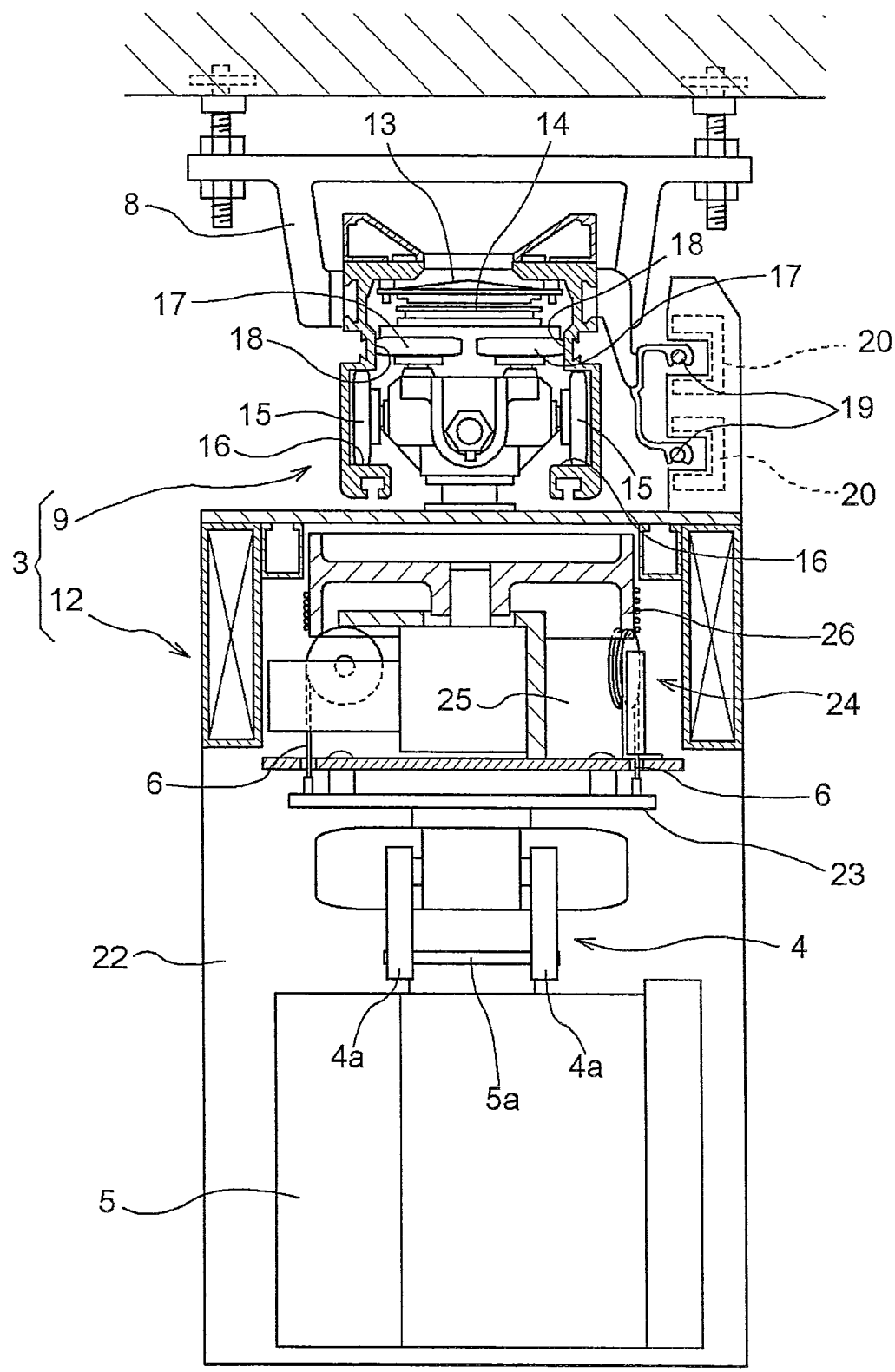
FIG. 4 is a vertical sectional front view of the vehicle.

The guide rail 2 is fixedly installed in the ceiling portion with guide rail brackets 8 as shown in FIGS. 2 to 4. The vehicle 3 consists of an upper vehicle body 9 located in an inner space of the guide rail 2 and a lower vehicle body 12 located below the guide rail 2 with the two bodies connected by a front and back connecting shafts 10 and 11.

The upper vehicle body 9 has a primary coil 14 arranged to be close to and face the magnet 13 provided in the inner space of the guide rail 2. The upper vehicle body 9 is a linear motor type which derives propelling force from the linear motor which consists of the magnet 13 and the primary coil 14, and the vehicle 3 is configured to move along the guide rail 2 by this propelling force. Formed in the inner space of the guide rail 2 are travel guide surfaces 16 for the travel wheels 15 provided to the upper vehicle body 9, and sway prevention guide surfaces 18 for sway prevention wheels 17 provided to the upper vehicle body 9.

The electric supply lines 19 are provided in the guide rail 2, and power receiving coils 20 are provided to the upper vehicle body 9 to generate magnetic field with the electric supply line 19 by running alternating current through the supply line 19. The power receiving coil 20 is caused to generate electric power required by the vehicle 3 by this magnetic field to contactlessly supply electric power.

Although the linear motor type which derives propelling force from the linear motor to drive the vehicle as a way to propel the upper vehicle body 9 is exemplified in this embodiment, a system for propelling the upper vehicle body 9, for example, by providing one or more electric motors for rotating the travel wheels 15 and by rotating the travel wheels 15 with one or more electric motors may also be used.

The lower vehicle body 12 consists of a fore-and-aft frame 21 extending in a fore-and-aft direction of the vehicle 3, and a front and back pair of vertical frames 22 extending downwardly from the front end part and back end part respectively of the fore-and-aft frame 21. The lower vehicle body 12 is formed to have a bracket shape that opens downwardly in a side view and has the grip portion 4 located in a central area thereof in the fore-and-aft direction.

The grip portion 4 is provided in the vertically movable body 23 which can be raised and lowered relative to the upper vehicle body 9, and this vertically movable body 23 can be raised and lowered with the raising-and-lowering operation mechanism 24 provided in the fore-and-aft frame 21.

The raising-and-lowering operation mechanism 24 is configured to wind four wires 6 around a rotation drum 26 that may be rotated by a drum driving motor 25. And the raising-and-lowering operation mechanism 24 is configured to rotate the rotation drum 26 in forward or reverse direction to wind or feed out the four wires 6 simultaneously to raise or lower the vertically movable body 23 while maintaining it in an approximately horizontal attitude.

Although this embodiment shows an example in which wires 6 are wound around the rotation drum 26, for example, belts may be wound around the rotation drum 26 to perform the raising-and-lowering operations of the vertically movable body 23. Thus, belts may be used instead of the wires 6.

A pair of grippers 4*a* for holding or gripping a flange 5*a* of the container 5 is provided in the grip portion 4. And the grip portion 4 is configured to be switched between a gripping attitude (shown with solid lines in FIG. 3) in which the pair of grippers 4*a* pivot toward each other by a forward or reverse rotation of a grip operation motor 27 to grip the flange 5*a*, and a release attitude (shown with dashed lines in FIG. 3) in which the pair of grippers 4*a* pivot away from each other to release the grip. The grip portion 4 is provided in the vertically movable body 23 for swinging about a vertical axis, and although not illustrated, a swing motor for swinging the grip portion 4 is provided.

Figure 5:
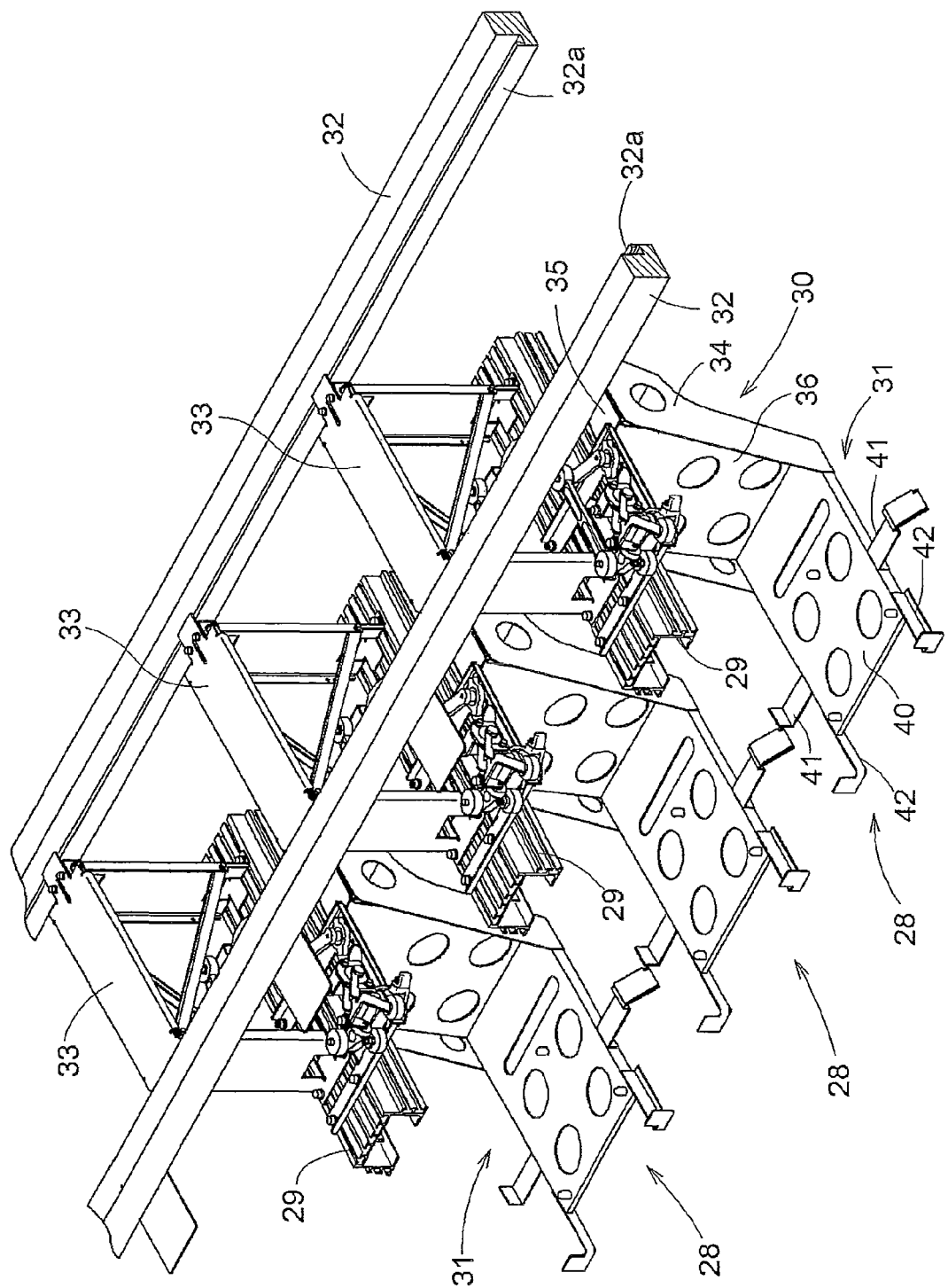
FIG. 5 is a perspective view of a plurality of installed article supports.
Figure 6:
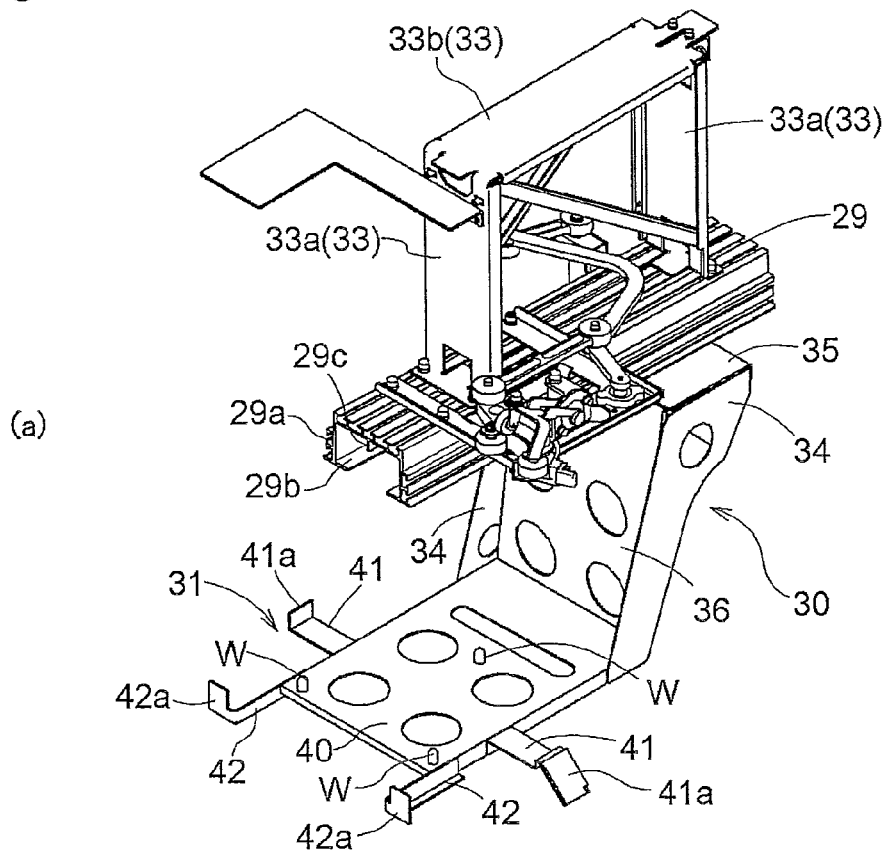
FIG. 6 is a perspective view of the article support.
Figure 6:
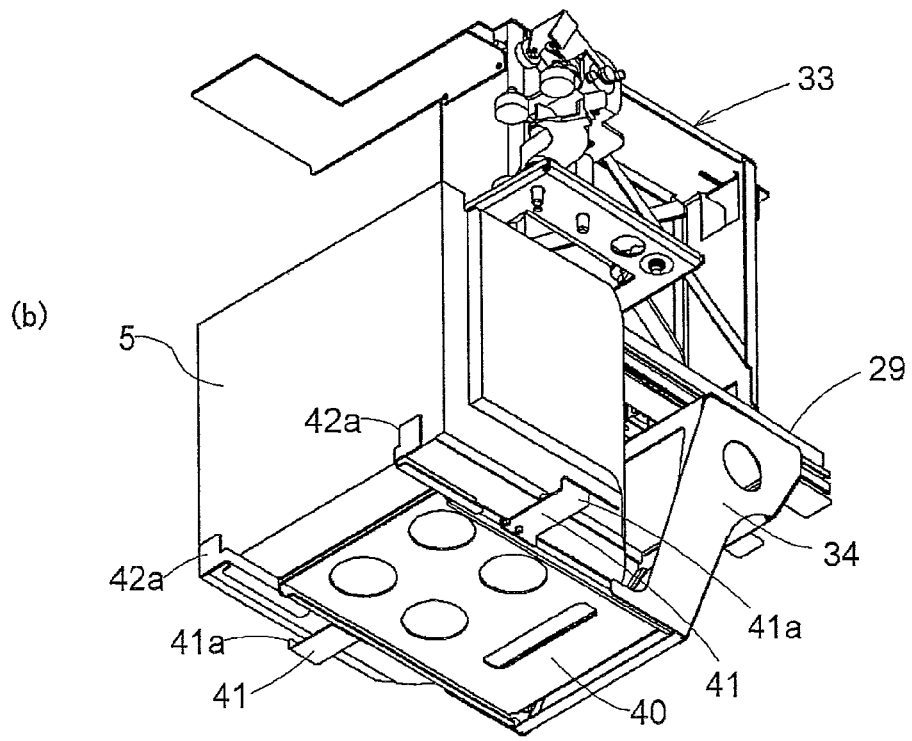
Figure 7:
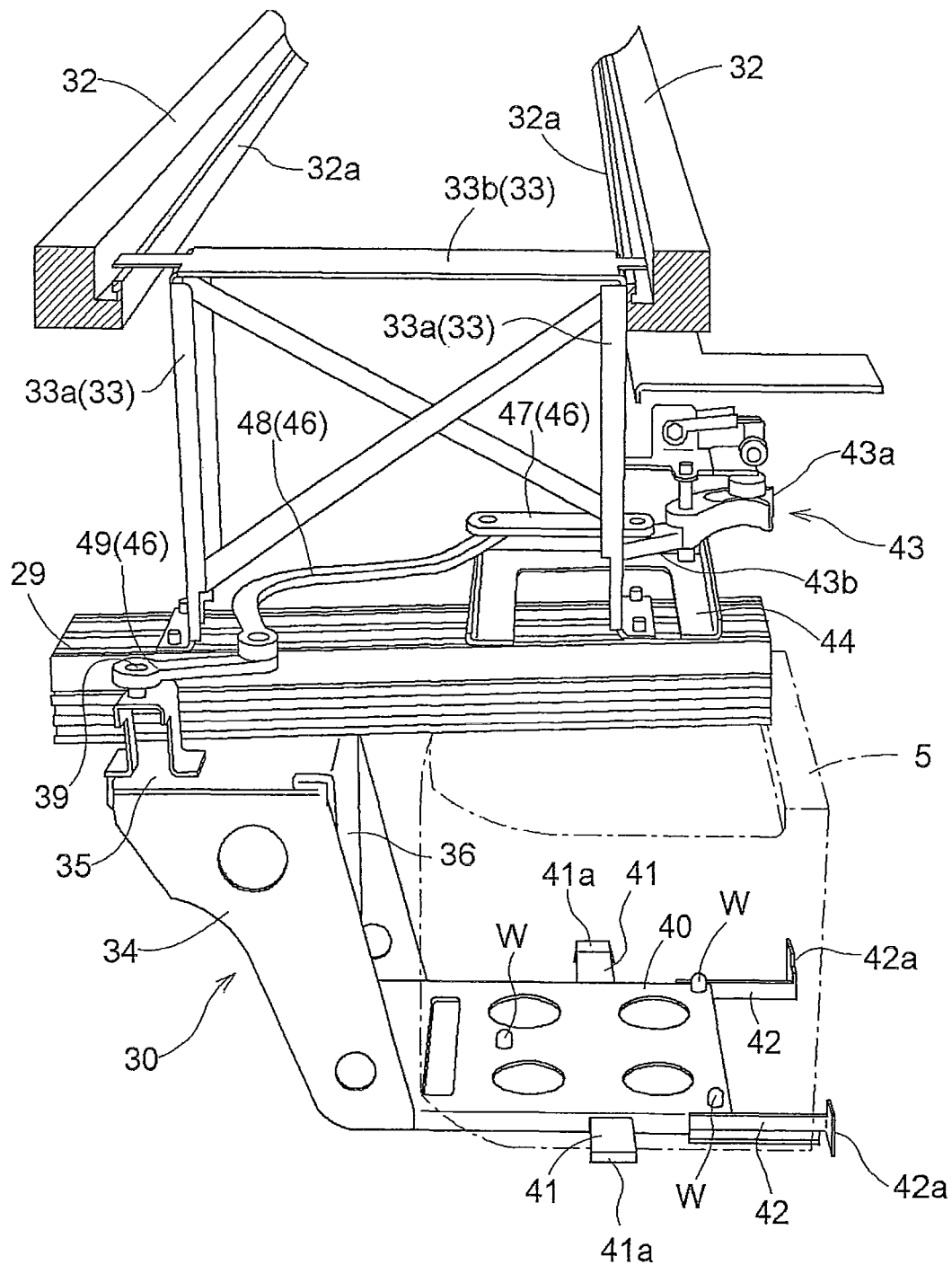
FIG. 7 is a perspective side view of the article support.
Figure 8:
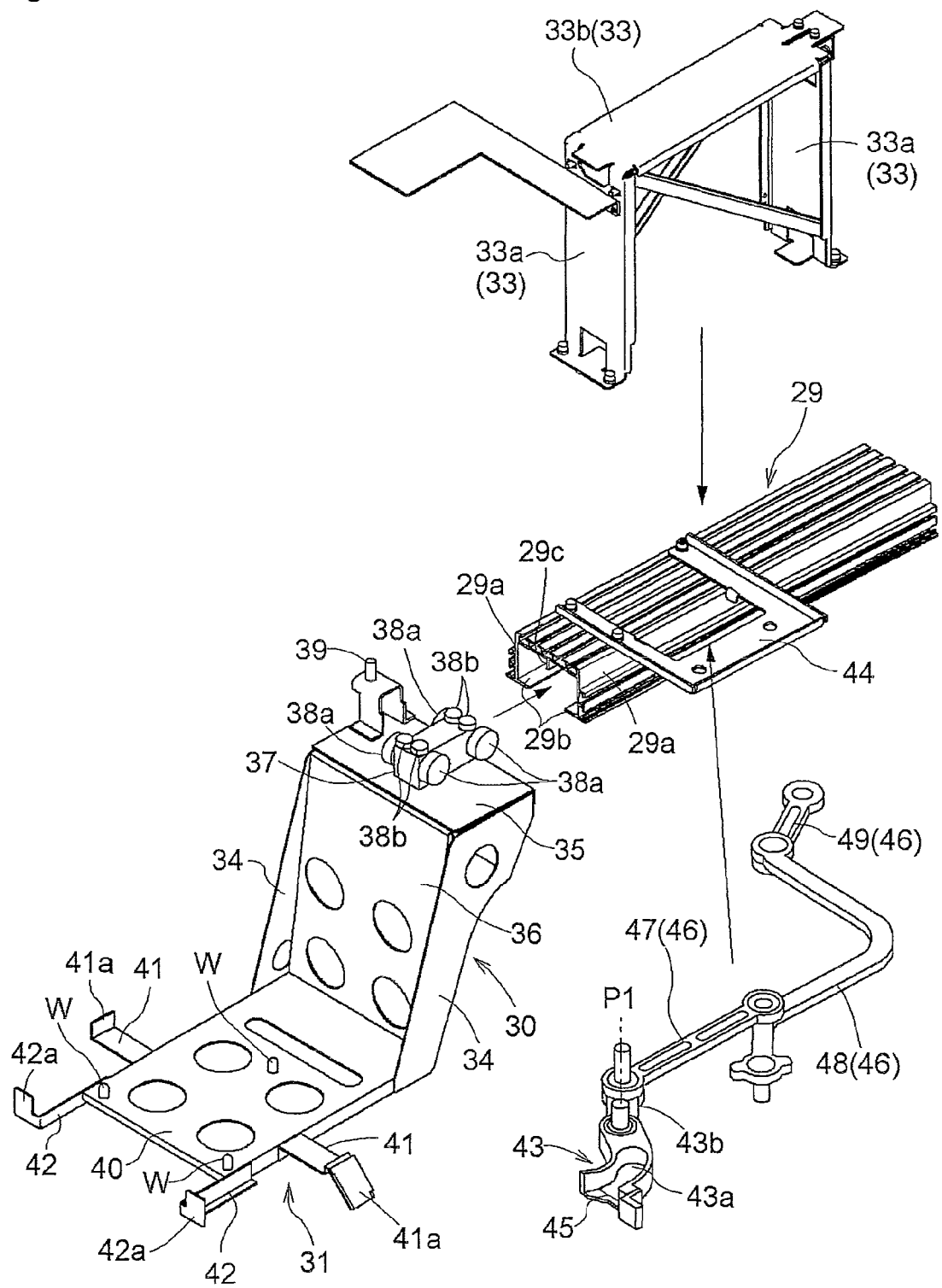
FIG. 8 is an exploded perspective view of the article support.

In order to temporarily deposit or store the container(s) 5 to be transported to station(s) 7, as shown in FIGS. 1 and 5, article supports 28 for storing articles are provided to both right and left of and in close proximity to the lateral sides of the guide rail 2. And a plurality of article supports 28 are arranged to be next to each other along the guide rail 2.

Hereafter, the article support 28 is described with reference to FIGS. 5 to 10.

Each of the plurality of article supports 28 is capable of changing positions between a projected position for article transfer (see FIG. 10) which projects closer toward the guide rail 2 for receiving an article from and delivering an article to the grip portion 4 of the vehicle 3 that is at rest at an article transfer location for the article support 28, and a pulled back position (see FIG. 9) which is located away from the guide rail 2.

Hereafter, the fore-and-aft direction of the vehicle 3 that is at rest at an article transfer location, i.e., the direction along the guide rail 2, is referred to as the "fore-and-aft direction" for short, and the direction away from and toward the vehicle 3 which is stopped at an article transfer location is referred to as the "far-near direction" for short.

The article transfer location is defined in correspondence with each of the plurality of article supports 28. The article support 28 is formed such that its width in the fore-and-aft direction is less than the interval or distance between the front and back pair of vertical frames 22 in the vehicle 3. Therefore, with the vehicle 3 stopped at an article transfer location, the article support 28 is configured such that it can be inserted and moved away from between the front and back pair of the vertical frames 22 of the vehicle 3.

The pulled back position is determined to be a position to a side of the guide rail 2 and away in the far-near direction from the location of the guide rail 2 such that, when the article support 28 is in the pulled back position, neither the article support 28 itself nor the container 5 which the article support 28 supports presents an obstacle to the movement of the vehicle 3 or to the raising and lowering of the grip portion 4.

The projected position is determined to be a position which overlaps in the horizontal direction with the grip portion 4 of the vehicle 3 at rest at the article transfer location, such that, when the article support 28 is located at the projected position, a container 5 can be delivered to and received from the grip portion 4 located in the position at or near the raised position with the vehicle 3 stopped at an article transfer location.

The article support 28 is supported to the fixed frame 29 installed in the ceiling region, at a location corresponding to the pulled back position, to be movable between the projected position and the pulled back position, as shown in FIGS. 5 to 8. The article support 28 has a movable body 30 which is supported to the fixed frame 29 to be movable in the far-near direction and which is shaped to extend downwardly from the fixed frame 29, and a support member 31 provided to extend toward the guide rail 2 in the far-near direction from the lower end portion of the movable body 30.

The fixed frame 29 is suspended from, span between, and is supported to a pair of fixed frame support rail bodies 32, which are spaced apart from each other in the far-near direction. The fixed frame 29 includes, as a suspending support portion 33, a vertical wall portion 33a extending upwardly from the fixed frame 29 at each of its one end side and the other end side in the far-near direction, and a horizontal connection portion 33b which connects the upper ends of the vertical wall portions 33a. Each of the pair of support rail bodies 32 is provided with a receptacle support portion 32a for receiving and supporting one end portion and the other end portion, in the far-near direction, of the horizontal connection portion 33b. The fixed frame 29 is configured to be suspended and supported by the pair of support rail bodies 32 by being supported by the receptacle support portion 32a in each of the pair of support rail bodies 32 to be fixed thereto.

The structure for suspending and supporting the fixed frame 29 in the ceiling region is not limited to the structure described above and may be different therefrom. For example, a bolt attachment groove may be provided in an upper end of the fixed frame 29, and the lower end portion of a suspension support may be fixedly fastened to this bolt attachment groove with a bolt. And the fixed frame 29 may be suspended and supported to the ceiling side by fixedly fastening the upper end of the suspending support to the ceiling.

The movable body 30 consists of a right-and-left pair of support arms 34, each of which is formed to have a shape that extends downwardly with the width in the far-near direction being smaller in the lower portion than in the upper portion, an upper connecting member 35 for connecting the upper ends of the right-and-left pair of support arms 34, and an intermediate connecting member 36 which connects support arm portions extending downwardly from the upper end of the right and left pair of support arms 34.

A plurality of holes are formed in the support arms 34 and the intermediate connecting member 36 in an effort to save weight. The upper connecting member 35 has a projection 37 which projects upwardly in the central part of the fore-and-aft direction, and a vertically-standing bar-shaped operated connection member 39 in an end portion in the fore-and-aft direction. The projection 37 is provided with two sets of right and left pair of first guide idlers 38a, on the lateral sides of the projection 37, with the first guide idlers 38a being supported to be rotatably about horizontal axes and with each set spaced apart from the other set in the far-and-near direction, and is provided with two sets of right and left pair of second guide idlers 38b, on the top surface, that are supported rotatably about vertical axes with each set spaced apart from the other set in the far-and-near direction.

The fixed frame 29 is formed in the shape of a tube with its downward part open to allow movement of the projection 37 in the far-near direction with the projection 37 of the movable body 30 inserted to inside the fixed frame 29 from below. The bottom part of the fixed frame 29 is not open over its full width in the fore-and-aft direction but is open only in its central portion, and is provided with bottom portions 29b extending horizontally from the both side wall portions 29a. The bottom portions 29b of the fixed frame 29 are configured to guide the first guide idlers 38a supported by the projection 37 inserted to within the fixed frame 29 for movement in the far-near direction. A guide rail portion 29c, which projects downwardly, is provided in the upper portion of the fixed frame 29 to extend along the far-near direction. The guide rail portion 29c is configured to guide the second guide idlers 38b supported by the projection 37 inserted to within the fixed frame 29 for movement in the far-near direction. Therefore, the movable body 30 is supported to the fixed frame 29 to be slidably movable with respect to the fixed frame 29 in the far-near direction.

The support member 31 consists of a contact support portion 40 which is narrower than the width of the container 5 in the fore-and-aft direction and which extends from the lower end portion of the movable body 30 toward the guide rail 2 in the far-near direction, and movement restricting portions 41 which are provided with vertical wall portions 41a extending in the fore-and-aft directions from the contact support portion 40 to contact side surfaces of the container 5 and which are formed to be narrower than the container 5 in the far-near direction. One pair of movement restricting portions 41 are provided such that one portion extends in one direction and the other extending in the other direction along the fore-and-aft direction from locations in the contact support portion 40 that correspond to the central part of the container 5 in the far-near direction.

Thus, with a container 5 supported by the article support 28, the vertical wall portions 41a in the movement restricting portion 41 are the only portions that project outwardly of the container 5 in the fore-and-aft direction, thus allowing clean air to flow from the ceiling region to the lower region through both sides of the vertical wall portion 41a. Therefore, it is possible to prevent obstructing the flow of clean air from the ceiling region to the lower region with a container 5 supported by the article support 28, and to store containers 5 in a clean environment with little dust. Thus, by providing the space which permits downward flow of clean air on both sides of the vertical wall portion 41a, the spaces which permit the downward flow of the clean air between the article supports 28 in the fore-and-aft direction can be made as small as possible as shown in FIG. 1. This allows a plurality of article supports 28 to be installed while reducing the intervals or distances between article supports 28 in the fore-and-aft direction. Therefore, a plurality of article supports 28 can be efficiently installed in a small space in the fore-and-aft direction.

And, the contact support portion 40 is located in the central part of the container 5 in the fore-and-aft direction, and thus can support the container 5 by contacting it in the central part of the container 5 in the fore-and-aft direction, allowing the container 5 to be stably supported. In addition, the vertical wall portions 41a of the movement restricting portions 41 contact the side surfaces of the container 5 to restrict any movement of the container 5 in the fore-and-aft direction.

The contact support portion 40 is configured to be narrower in the far-near direction than the container 5 so as to form an empty space on the side of the guide rail 2 in the far-near direction. This allows clean air to flow from the ceiling region to lower region in the empty space when the article support 28 is not supporting the container 5, thus, allowing the article support 28 itself to be a clean environment with little dust.

The contact support portion 40 is provided with far-near direction movement restricting portions 42 which have vertical wall portions 42a extend in the far-near direction from the contact support portion 40 to contact the side surfaces of the container 5 and which are narrower than the contact support portion 40 in the fore-and-aft direction. The far-near direction movement restricting portions 42 are provided in both end portions of the contact support portion 40 in the fore-and-aft direction. This allows the container 5 to be supported while restricting any movement of the container 5 in the far-near direction. A plurality of positioning pins W are provided in the contact support portion 40 to support the container 5 while maintaining it in position. The positioning pins W are located at each corner of a triangle in plan view. A plurality of holes are formed in the contact support portion 40 to allow downward flow of clean air when the article support 28 is not supporting a container 5 and to save weight.

The movable body 30 and the contact support portion 40 are arranged to be next to each other in the far-near direction, and are configured to have the same or approximately the same width in the fore-and-aft direction. The fixed frame 29 is provided in the central part of the movable body 30 in the fore-and-aft direction, to support the movable body 30 with sufficient balance for stable movement in the far-near direction. The fixed frame 29 is located such that it overlaps with the article support 28 in the pulled back position in the fore-and-aft direction and in the far-near direction, and is formed to be narrower than the contact support portion 40 in the fore-and-aft direction. This prevents the fixed frame 29, at locations other than the article support 28 in the horizontal direction, from obstructing the downward flow of clean air.

The fixed frame 29 is provided with an operated member 43 supported to be movable between a proximate position (see FIG. 9) close to the vehicle 3 stopped at the article transfer location in the far-near direction, and a spaced apart position (see FIG. 10) spaced apart or away from the vehicle 3 stopped at the article transfer location. The operated member 43 is operatively connected with the article support 28 such that in its proximate position, the article support 28 is operated to the pulled back position, and in the spaced apart position, the article support 28 is operated to the projected position.

The operated member 43 is pivotably connected, at its longitudinally central portion, to a bracket shaped base 44 provided to an upper portion of the fixed frame 29, and is pivotable about a first pivot axis P1, which is the location of the connection. The operated member 43 has a first operated portion 43 which extends from the first pivot axis P1 toward the vehicle 3 when the operated member 43 is in the proximate position, and a second operated portion 43b which extends from the first pivot axis P1 and away from the vehicle 3, with the first and second operated portions being integrally formed with one positioned higher than the other.

The operated member 43 can be switched between the proximate position and the spaced apart position by pivoting it about the first pivot axis P1, and is configured such that, in the proximate position (see FIG. 9), it assumes an attitude in which the first operated portion 43 comes closer to the vehicle 3 stopped in the article transfer location than the first pivot axis P1. The first operated portion 43a of the operated member 43 is provided with a groove 45 extending along a direction which intersects the far-near direction and toward the first pivot axis P1 when the operated member 43 is in the proximate position. This groove portion 45 is formed to have a shape in which its end which is closer to the vehicle 3, stopped in the article transfer location, opens along the far-near direction.

Figure 9:
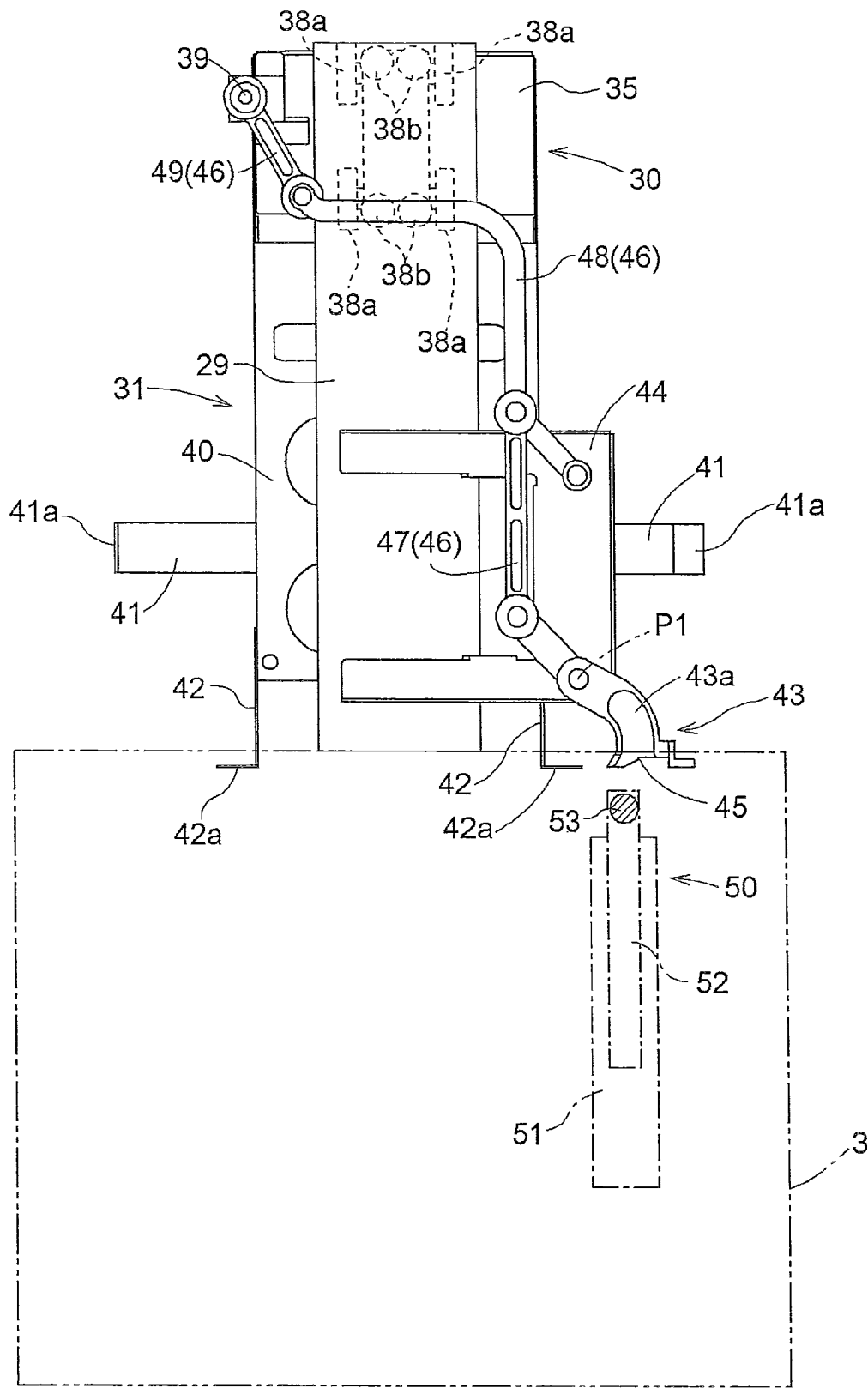
FIG. 9 is a plan view of the article support in the pulled back position.
Figure 10:
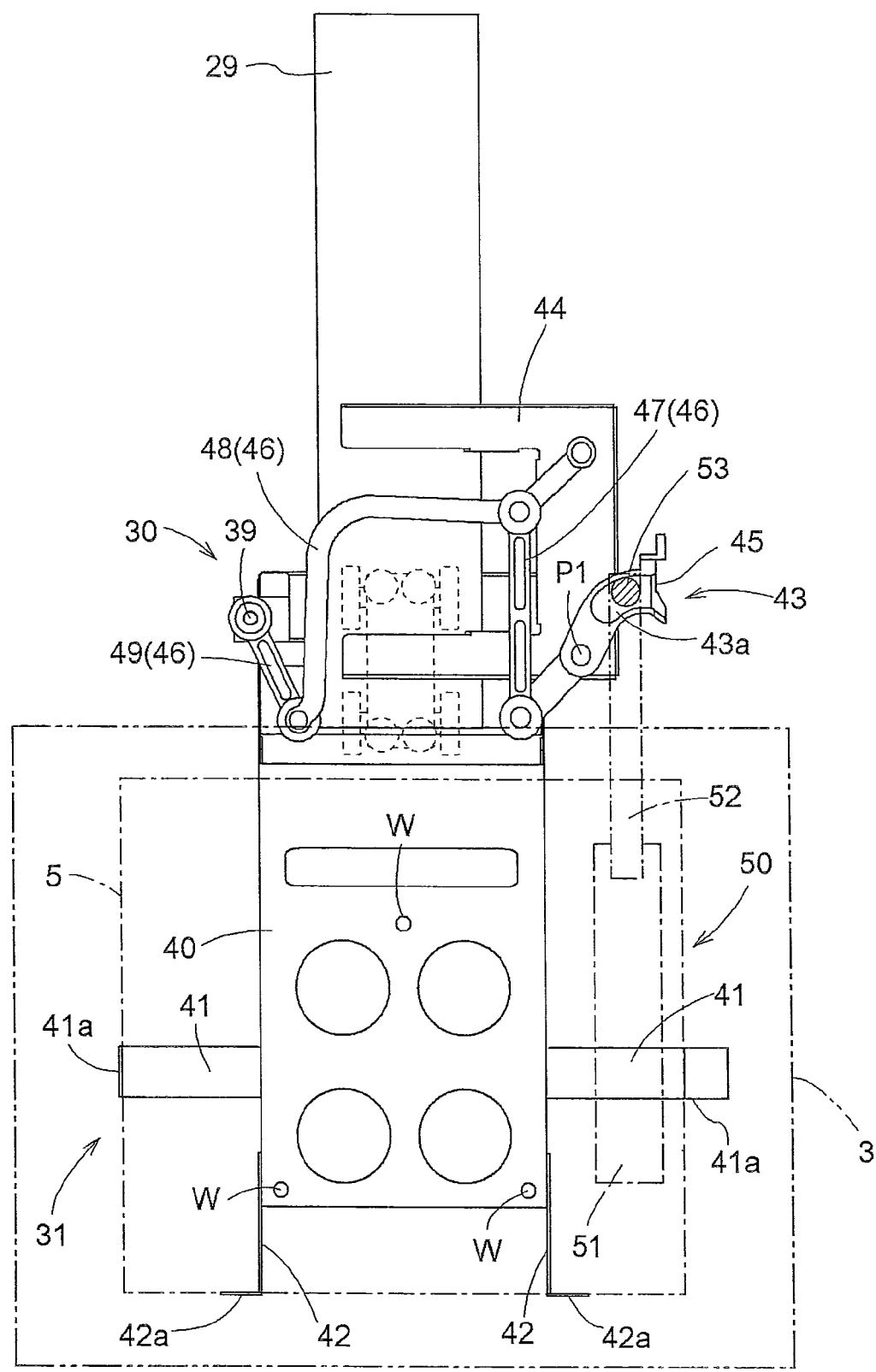
FIG. 10 is a plan view of the article support in the projected position.

The linkage mechanism 46 for operatively connecting the motion of the operated member 43 and the motion of the article support 28 is provided so that the article support 28 is caused to be in the pulled back position when the operated member 43 is moved to the proximate position, as shown in FIG. 9, and the article support 28 is caused to be in the projected position when the operated member 43 is moved to the spaced apart position, as shown in FIG. 10.

The linkage mechanism 46 consists of three link arms: the first link arm 47, the second link arm 48, and the third link arm 49, which can be pivoted about vertical axes. The first link arm 47 has one end portion pivotably connected to an end portion of the second operated portion 43b of the operated member 43 and the other end portion pivotably connected to a longitudinally intermediate portion of the second link arm 48. The second link arm 48 has one end portion pivotably connected to the base 44, and the other end portion pivotably connected to one end portion of the third link arm 49. The third link arm 49 is pivotably connected, at the other end portion, to the operated connection member 39 standing vertically in the fixed frame 29.

As shown in FIGS. 9 and 10, the operation means 50 for switching or moving the article support 28 between the pulled back position and the projected position is provided in the vehicle 3. The operation means 50 consists of a base 51 which is fixed to the vehicle 3 and is long in the far-near direction, an operating member 52 which is long and is capable of moving in the far-near direction with respect to the base 51, and an engaging roller 53 provided to the underside of the distal end portion of the operating member 52. The operation means 50 is configured to move the operating member 52 in and out relative to the base 51 by operating an actuator, which is not shown, to perform a projecting operation and a pulling back operation to move the engaging roller 53 in the far-near direction. Incidentally, the vehicle 3 is provided with operation means 50 for switching the article support 28 located on the right-hand side with respect to the travel direction of the vehicle 3, and operation means 50 for switching the article support 28 located on the left-hand side with respect to the travel direction of the vehicle 3.

The engaging roller 53 is formed to be of the same diameter as, or of a diameter smaller than, the width of the groove 45 of the operated member 43 in the fore-and-aft direction. This allows the engaging roller 53 to engage and disengage the groove 45 of the operated member 43 through movement in the far-near direction. The operation means 50 is a push-pull type which performs a projecting operation to cause the engaging roller 53 to engage the groove 45 and to push the operated member 43 from the proximate position to the spaced apart position, and performs a pulling back operation to cause the engaging roller 53 to engage the groove 45 to pull the operated member 43 from the spaced apart position to the proximate position, and thereafter, causes the engaging roller 53 to be moved out of the groove 45.

As the operation means 50 moves the operated member 43 from the proximate position to the spaced apart position by means of the engaging roller 53 through a projecting operation, the operated member 43 moves to the spaced apart position, and the article support 28 is operated to the projected position, resulting in the change in the position of the article support 28 from the pulled back position to the projected position. Conversely, as the operation means 50 operates the operated member 43 from the spaced apart position to the proximate position by means of the engaging roller 53 and through a pulling back operation, the operated member 43 moves to the proximate position, and the article support 28 is operated to the pulled back position, resulting in the change in the position of the article support 28 from the projected position to the pulled back position.

The movements associated with position changes of the article support 28 between the pulled back position and the projected position are described next.

As shown in FIG. 9, because the opening of the groove 45 opens in the far-near direction when the operated member 43 is in the proximate position, as the engaging roller 53 moves in a direction which makes it project from the vehicle 3 in the far-near direction as the operation means 50 performs a projecting operation, the engaging roller 53 enters, fits into, and engages the groove 45 through the opening thereof. And by moving in the direction which tends to make the engaging roller 53 project from the vehicle 3 in the far-near direction after the engaging roller 53 has engaged the groove 45, the engaging roller 53 pushes the side wall portion of the groove 45 as it moves to push the operated member 43 from the proximate position to the spaced apart position. As the operated member 43 is pivoted from the proximate position to the spaced apart position, the first link arm 47, the second link arm 48, and the third link arm 49 are pivoted in turn, resulting in a movement of the operated connection member 39 toward the vehicle 3. Therefore, a movement of the operated connection member 39 toward the vehicle 3 causes a sliding movement of the movable body 30, resulting in the position change of the article support 28 from the pulled back position to the projected position as shown in FIG. 10.

When the operation means 50 performs a pulling back operation when the operated member 43 is located in the spaced apart position as shown in FIG. 10, this causes the engaging roller 53, which is engaged with the groove 45, to move toward the vehicle 3, so that the engaging roller 53 presses against the side wall portion of the groove 45 as it moves, and pulls the operated member 43 from the spaced apart position into the proximate position. As the operated member 43 is pivoted from the spaced apart position to the proximate position, the first link arm 47, the second link arm 48, and the third link arm 49 are pivoted in turn, resulting in a movement of the operated connection member 39 away from the vehicle 3. Therefore, a movement of the operated connection member 39 away from the vehicle 3 causes a sliding movement of the movable body 30, resulting in the position change of the article support 28 from the article transfer position to the article storing position. As shown in FIG. 9, because the opening of the groove 45 opens in the far-near direction when the operated member 43 is in the proximate position, as the engaging roller 53 moves toward the vehicle 3, the engaging roller 53 is disengaged from the groove 45, and returns to the vehicle 3.

A carriage controller which controls operation of the vehicle 3 is provided in the vehicle 3. And the carriage controller is configured to control movement of the vehicle 3 and the raising-and-lowering operation of the grip portion 4 as well as the operations of the grip motor 27 and the operation means 50 based on commands from a managing computer which manages the overall operation of the article transport facility, and on the detected information from the various sensors provided in the vehicle 3.

For example, when the managing computer specifies the station 7 which is the transport origin and the transport destination among the plurality of stations 7, and issues a transport command to transport a container 5 from the station 7 which is transport origin to a destination station 7, the carriage controller is configured to control the operation of the vehicle 3 to receive the container 5 from the station 7 which is the transport origin and unload the container 5 to the destination station 7.

When receiving a container 5 from the station 7 of transport origin, the carriage controller first controls movement of the vehicle 3 to move the vehicle 3 to a stop position corresponding to the station 7 of transport origin. Next, with the vehicle 3 at rest at the stop position corresponding to the station 7 of transport origin, the carriage controller controls the raising and lowering operation of the grip portion 4 to lower the grip portion 4 from the raised position to the lowered position. And when the grip portion 4 reaches the lowered position, the carriage controller operates the grip operation motor 27 to switch the pair of grippers 4a to the gripping posture in order to grip the flange 5a of the container 5 with the pair of grippers 4a to receive the container 5. Thereafter, the carriage controller controls the raising-and-lowering operation of the grip portion 4 in order to raise the grip portion 4 from the lowered position to the raised position, and then controls movement of the vehicle 3 to move the vehicle 3 to the stop position corresponding to the station 7 of transport destination.

The carriage controller is configured to control the raising-and-lowering operation of the grip portion 4, and the operation of the grip operation motor 27, when the vehicle 3 stops at the stop position corresponding to the station 7 of the transport destination, to unload the container 5 to the station 7 of the transport destination, as in the case where the container 5 is received from the station 7 of transport origin.

Described next is a situation where a store command is issued by the managing computer to store or deposit a container 5 in an article support 28 with a target article support 28 for transfer being specified among a plurality of article supports 28.

First, the carriage controller controls movement of the vehicle 3 to move the vehicle 3 to an article transfer location corresponding to the target article support 28 for transfer. Next, the carriage controller causes the operation means 50 to be projected, with the vehicle 3 stopped at the article transfer location corresponding to the target article support 28 for transfer. The projecting operation of the operation means 50 effectuates the position change of the article support 28 from the pulled back position to the projected position. After controlling the raising-and-lowering operation of the grip portion 4 to lower the grip portion 4 from a raised position to a position close to the raised position, the carriage controller operates the grip operation motor 27 to switch the pair of grippers 4a to the release posture to unload the container 5 from the grip portion 4 to the article support 28 located in the article transfer position. Then, after the carriage controller controls the raising-and-lowering operation of the grip portion 4 to raise the grip portion 4 to the raised position, it pulls back the operation means 50. And the article support 28 is caused to change its position from the projected position to the pulled back position as the operation means 50 performs the pulling back operation.

Described next is a situation where a retrieve command is issued by the managing computer to retrieve a container 5 stored in an article support 28 with a target article support 28 for transfer being specified among a plurality of article supports 28.

The carriage controller causes the vehicle 3 to stop at the article transfer location corresponding to the target article support 28 for transfer by controlling movement of the vehicle 3, similar to the case where a store command is issued. And the carriage controller effectuates the position change of the article support 28 from the article storing position to the article transfer position. Thereafter, after controlling the raising-and-lowering operation of the grip portion 4 to lower the grip portion 4 from the raised position to a position close to the raised position, the carriage controller operates the grip operation motor 27 to switch the pair of grippers 4a to the gripping posture to retrieve the container 5 from the article support 28 to the grip portion 4. And, after the carriage controller controls the raising-and-lowering operation of the grip portion 4 to raise the grip portion 4 to the raised position, it pulls back the operation means 50. The article support 28 is caused to change its position from the projected position to the pulled back position as the operation means 50 performs the pulling back operation.

Alternative Embodiments (1) Although the article support 28 is configured such that the container 5 may be delivered to and received from the grip portion 4 located in a position close to the raised position when the article support 28 is in the projected position in the embodiment described above, the article support 28 may also be configured such that the container 5 may be delivered to and received from the grip portion 4 in the raised position for example, when the article support 28 is in the projected position.

And the position at which the article support 28 in the projected position delivers and receives the container 5 to and from the grip portion 4 is not limited to a position close to the raised position, or the raised position, but, may be a position which is lower than the raised position by a predetermined height. In this case, with the article support 28 located in the projected position, the container 5 can be delivered and received between the article support 28 and the grip portion 4 by lowering the grip portion 4 from the raised position by a predetermined height.

(2) Although a plurality of article supports 28 are arranged next to one another along the guide rail 2 in the embodiment above, the number of the article supports 28 installed may be changed to suit the circumstance. And, with regard to the installation positions of the article supports 28, although they may be provided on both right and left sides of the guide rail 2, it is also possible to install them only on one side of the guide rail 2.

(3) In the embodiment described above although the vehicle 3 is provided with two operation means 50, i.e. one for performing a switching operation of the article supports 28 located on the right hand side with respect to the travel direction of the vehicle 3, and another operation means 50 for performing a switching operation of the article supports 28 located on the left hand side with respect to the travel direction of the vehicle 3, by providing operation means 50 that can project and retrieve the engaging roller both to the right and left with respect to the travel direction of the vehicle 3, for example, the vehicle 3 may perform the operation with one operation means.

(4) Although an article transport facility which transports, as an article, containers 5 for storing semiconductor substrates is used as an example in the above-described embodiment, the article to transport may be changed suitably.

The present invention can be used advantageously for an article transport facility in which an article transporting body is provided to be movable along a travel path in the ceiling region and extending along article transfer locations corresponding to article supports.

The invention claimed is:

1. An article transport facility comprising:
an article transporting body movable along a travel path provided near a ceiling and extending to pass by one or more article transfer locations corresponding to one or more article supports, wherein each article support is supported to a fixed frame installed in the ceiling to be movable relative to the fixed frame between a projected position, for article transfer, which projects toward the travel path, and a pulled back position which is farther away from the travel path, and wherein the article transporting body is configured to deliver an article to and receive an article from the article support in the projected position when the article transporting body is at rest in the article transfer location,
wherein the article support includes a movable body supported by the fixed frame to be movable in a far-near direction with respect to the travel path and formed to extend downwardly from the fixed frame, and a support member extending along the far-near direction from a lower end portion of the movable body, and the support member includes a contact support portion which is narrower than a width of the article in a direction along the travel path and which extends in the far-near direction from the lower end portion of the movable body, a first movement restricting portion and a second movement restricting portion, each of which is formed to be narrower than the article in the far-near direction with respect to the travel path and is longer in the direction along the travel path than in the far-near direction with respect to the travel path in plan view, wherein
the first movement restricting portion includes:
a first extended portion which extends, under the article and in one direction along the travel path, from the contact support portion at a position that corresponds to a central portion of the article in the far-near direction when the article is supported by the contact support portion, and
a first vertical wall portion which extends upwardly from an end area of the first extended portion for contacting a side surface of the article; and wherein
the second movement restricting portion includes:
a second extended portion which extends, under the article and in the other direction along the travel path, from the contact support portion at the position that corresponds to the central portion of the article in the far-near direction when the article is supported by the contact support portion, the other direction being a direction opposite to the one direction, and a second vertical wall portion which extends upwardly from an end area of the second extended portion for contacting a side surface of the article.

2. The article transport facility as defined in claim 1, wherein a plurality of the article supports are provided adjacent one another along the travel path.

3. The article transport facility as defined in claim 1, wherein the contact support portion is formed to be shorter in length than the article in the far-near direction with respect to the travel path, and includes a far-near direction movement restricting portion extending in the far-near direction from the contact support portion and having a vertical wall portion which contacts a side surface of the article, the far-near direction movement restricting portion being formed to be narrower than the contact support portion in the direction along the travel path.

4. The article transport facility as defined in claim 1, wherein a plurality of holes are formed in the contact support portion.

5. The article transport facility as defined in claim 1, wherein the fixed frame for each article support is positioned such that the fixed frame overlaps with the article support in the pulled back position in the direction along the travel path and in the far-near direction.

6. The article transport facility as defined in claim 1, wherein a pair of support rail bodies spaced apart from each other in the far-near direction is provided for supporting the fixed frame such that the support rail bodies extend along the travel path, and the fixed frame is suspended and supported by the pair of support rail bodies such that the fixed frame is received and supported by a receptacle support portion of each of the pair of support rail bodies.

7. The article transport facility as defined in claim 2, wherein the contact support portion is formed to be shorter in length than the article in the far-near direction with respect to the travel path, and includes a far-near direction movement restricting portion extending in the far-near direction from the contact support portion and having a vertical wall portion which contacts a side surface of the article, the far-near direction movement restricting portion being formed to be narrower than the contact support portion in the direction along the travel path.

8. The article transport facility as defined in claim 2, wherein a plurality of holes are formed in the contact support portion.

9. The article transport facility as defined in claim 3, wherein a plurality of holes are formed in the contact support portion.

10. The article transport facility as defined in claim 2, wherein the fixed frame for each article support is positioned such that the fixed frame overlaps with the article support in the pulled back position in the direction along the travel path and in the far-near direction.

11. The article transport facility as defined in claim 3, wherein the fixed frame for each article support is positioned such that the fixed frame overlaps with the article support in the pulled back position in the direction along the travel path and in the far-near direction.

12. The article transport facility as defined in claim 4, wherein the fixed frame for each article support is positioned such that the fixed frame overlaps with the article support in the pulled back position in the direction along the travel path and in the far-near direction.

13. The article transport facility as defined in claim 2, wherein a pair of support rail bodies spaced apart from each other in the far-near direction is provided for supporting the fixed frame such that the support rail bodies extend along the travel path, and the fixed frame is suspended and supported by the pair of support rail bodies such that the fixed frame is received and supported by a receptacle support portion of each of the pair of support rail bodies.

14. The article transport facility as defined in claim 3, wherein a pair of support rail bodies spaced apart from each other in the far-near direction is provided for supporting the fixed frame such that the support rail bodies extend along the travel path, and the fixed frame is suspended and supported by the pair of support rail bodies such that the fixed frame is received and supported by a receptacle support portion of each of the pair of support rail bodies.

15. The article transport facility as defined in claim 4, wherein a pair of support rail bodies spaced apart from each other in the far-near direction is provided for supporting the fixed frame such that the support rail bodies extend along the travel path, and the fixed frame is suspended and supported by the pair of support rail bodies such that the fixed frame is received and supported by a receptacle support portion of each of the pair of support rail bodies.

16. The article transport facility as defined in claim 5, wherein a pair of support rail bodies spaced apart from each other in the far-near direction is provided for supporting the fixed frame such that the support rail bodies extend along the travel path, and the fixed frame is suspended and supported by the pair of support rail bodies such that the fixed frame is received and supported by a receptacle support portion of each of the pair of support rail bodies.

17. The article transport facility as defined in claim 1, wherein the fixed frame is formed in a shape of a horizontally extending tube that is narrower than the contact support portion in the direction along the travel path and that opens downwardly.

* * * * *